United States Patent [19]

Guertin

[11] 4,312,667

[45] Jan. 26, 1982

[54] METHOD OF FORMING LARGE, MINIMAL GRAIN COPPER BILLET

[75] Inventor: Jacques P. Guertin, Cupertino, Calif.

[73] Assignee: McGraw-Edison Company, Rolling Meadows, Ill.

[21] Appl. No.: 130,993

[22] Filed: Mar. 17, 1980

[51] Int. Cl.³ .............................................. C22B 15/00
[52] U.S. Cl. ...................................... 75/72; 75/65 R
[58] Field of Search ...................................... 75/72, 65

[56] References Cited

U.S. PATENT DOCUMENTS

| 3,234,351 | 2/1966 | Hebb | 200/144 |
| 3,470,936 | 10/1969 | Jandras | 164/61 |
| 3,948,650 | 4/1976 | Flemings | 75/65 R |
| 3,960,647 | 6/1976 | Faure | 75/65 ZM |

Primary Examiner—P. D. Rosenberg

Attorney, Agent, or Firm—Ronald J. LaPorte; Jon C. Gealow; Charles W. MacKinnon

[57] ABSTRACT

A recrystallized copper billet in excess of one and one-half inches in diameter is formed as an essentially single-grain or crystal copper. A high conductivity, oxygen-free copper billet is subjected to mechanical surface cleaning and to a "bright dip" bath to chemically clean the surface. The copper billet is located in a similar sized graphite crucible and induction-heated in a vacuum chamber to a modest temperature for outgassing of said crucible. The heating is increased to melt the copper and then is reduced in steps to produce a copper equilibrium temperature about seventeen degrees centigrade above the melting point of the copper. A slow non-directional and natural cooling at the rate of about three to fifteen degrees per hour is created until total solidification and recrystallization occurs.

14 Claims, 5 Drawing Figures

METHOD OF FORMING LARGE, MINIMAL GRAIN COPPER BILLET

BACKGROUND OF THE INVENTION

This invention relates to a method of forming large minimal grain or crystal copper blocks and particularly to the forming of an essentially single-grain or crystal copper in sizes in excess of one and one-half inches in diameter.

Various uses of copper require relatively high purity copper because of the effects of the release of trapped impurities, such as gases and the like, under operational conditions. Often, copper which is generally sold as an oxygen-free, high conductivity copper includes a substantial number of individual grains. The impurities in copper are generally trapped at the grain boundaries. Such impurities can be liberated under certain operating conditions, producing undesirable results. This can occur, for example, wherein such copper is included in the conductive components of power system vacuum interrupters, widely employed in the power industry, plasma devices and the like. This is particularly true of internal interrupter elements, such as, contacts, and the like, which are subject to arcing under operating conditions. Generally, the arcing of such contacts tends to erode the surface copper and liberates any impurities therein. Thus, great care is taken in the casting and processing of copper to form such contacts to minimize the presence of impurities, thereby increasing the performance characteristics of the interrupter.

Although current interruption is preferably made with pure copper content, normal reclosing under power on conditions could result in welding the contacts to each other such that the interrupter mechanism could not open the contacts on the next demand for interruption. Such welding is conveniently minimized by the addition of small amounts of antiwelding materials, such as, bismuth, to the copper from which the contact is formed. The additive material may, however, significantly degrade the interrupting characteristic of the contact. To overcome the latter, the contact is generally designed to locate the initial arc on a first portion of the contact surface and then move the arc across the contact surface to a second portion. This permits construction of a composite contact with the first portion including the antiweld material and the second portion of an essentially pure copper. Such contacts are generally formed with an inner button portion connected to an outer annular portion at the periphery or via a curved intermediate runner portion. The inner and outer portions are axially offset such that the arc runner portions of opposed contacts are more closely spaced and the arc is initiated thereat moving therefrom to the main, highly conductive portions.

Interrupter contacts of essentially pure copper having a diameter of approximately five inches, are generally employed in the power systems industry. The refined copper used in forming such contacts may be melted and recrystallized a number of times under special procedures to form contacts or blocks of a diameter for separation into a plurality of contact buttons for use in the interrupters. Generally, the copper is cast into an ingot having the contact diameter. It is then cut and machined into the appropriate contact for a particular vacuum-type interrupter. The finished contact is mounted within the vacuum chamber of the interrupter in a suitable manner to prevent contamination of the electrode or contact. Oxygen or other impurities trapped within the copper grain structure or matrix may be minimized during the casting process by the agitation of the liquid metal or by the addition of various gettering materials or agents. For example, U.S. Pat. No. 2,054,923, issued Sept. 22, 1936, suggests agitation of the melted metal to expose the metal to the surface within a vacuum. U.S. Pat. No. 1,948,316 suggests the addition of a gas reducing hydrogen to the melt under vacuum, while U.S. Pat. Nos. 3,738,827 and 3,776,719 suggest the addition of a gettering agent to the melt. Still other patents, such as U.S. Pat. No. 3,234,351 have suggested directional cooling during crystallization to develop a crystallizing multiple crystal copper ingot having grains whose surface to volume ratio is no greater than six per centimeter. However, relatively large contacts for vacuum interrupters would include a substantial number of crystals or grains requiring that special care be taken to minimize any trapped gaseous constituents.

Still another U.S. Pat. No. 3,470,936 discloses a method of forming high purity copper for the purpose of improving the cold working characteristics thereof as well as its resistance to corrosion. It can be seen that the need for a highly improved high purity copper, and particularly one with a large essentially single-grain or single-crystal structure in order to minimize entrapment of impurities at the grain boundaries, exists.

SUMMARY OF THE PRESENT INVENTION

Accordingly, the present invention is directed to an improved method of refining or recrystallizing a solid copper mass to form a large, generally single-grain or single-crystal copper billet having a diameter in excess of one and one-half inches.

In accordance with the present invention, generally oxygen-free, high conductivity copper is recrystallized by vacuum melting at a temperature above the melting point of copper under a relatively high vacuum and then subjected to a slow, controlled, natural, non-directional cooling, with minimal agitation of the copper melt. It has been found that a slow, non-forced cooling under these conditions results in a dramatic recrystallization wherein the copper is formed with essentially a single-grain or at most, only a few grains in the recrystallized billet. For example, a conventional oxygen-free, high conductivity copper which may include on the order of one hundred grains of copper has been recrystallized into a billet having as little as two to six grains.

Generally, in accordance with the method of the subject invention, a copper mass of any suitable shape, which will fit into an appropriate crucible having a cross section approximating that of the final billet with clearance for suitable thermal expansion, is provided. The copper mass is suitably processed to thoroughly clean the surface thereof. Generally, the surface cleaning includes washing with soap and methyl alcohol followed by cleaning in a "bright dip" acid bath.

The surface cleaned copper mass is located within a suitable crucible, such as, for example, a well-known graphite type which is fitted with a removable cover. The loaded crucible is mounted within a vacuum chamber having a heating means such as a coiled induction heater, mounted to encircle the crucible. The induction heater is energized at a relatively low level to slowly increase the temperature of the crucible and cleaned copper mass, as well as the surrounding components, thereby to outgas the crucible and the surrounding components without significant degradation. The input power is then increased to a high level such that the copper mass begins to melt. After the copper mass is melted, power to the heater is reduced to a level to cool the copper mass to a temperature just above its melting point. After an equilibrium temperature is reached, the important step of a slow, natural cooling of the copper mass is initiated. Generally, cooling on the order of three degrees centigrade per hour permits solidification of the melted copper mass at an acceptable rate. This relatively slow and natural or nondirectional cooling is significant in providing proper recrystallization of the copper mass. The rate, while slow, does however, permit practical solidification under commercial conditions. After solidification, heating is terminated and the resulting copper billet is allowed to cool, preferably without the use of any auxiliary cooling means. After all components have cooled sufficiently, the system is purged with a gas such as, nitrogen, and the recrystallized copper billet is removed from the crucible. It has been found that the resulting recrystallized copper billet is essentially a single-grain or crystal which may have a diameter on the order of five inches and include a total oxygen content of less than two parts per million (ppm).

More particularly, in a preferred and particularly unique embodiment of the present invention, a high conductivity, oxygen-free copper billet is subjected to wire brush scrubbings employing a suitable commercial soap and distilled water, followed by rinsing with methyl alcohol and drying with a warm air stream. A "bright dip" bath of 55% phosphoric acid, 25% acetic acid, 20% nitric acid by volume is employed to further, chemically clean the surface, followed by distilled water and methyl alcohol rinses and finally warm air drying to complete the cleaning process. The surface cleaned copper billet is then located in a cup-shaped graphite crucible of a slightly greater inside diameter than the size of the copper billet and placed in an induction-heated vacuum chamber. The vacuum is drawn as the filled graphite crucible is heated at a low outgassing temperature for approximately thirty minutes, after which maximum power is applied, maintained for a period of seventy-five minutes following initial melting of the copper billet and then reduced in steps to create an equilibrium temperature at approximately 1100 degrees C., that is, seventeen degrees above the melting point of copper. The heating is then reduced to establish a slow cooling at the rate of about 3 to 15 degrees centigrade per hour until total solidification occurs, at which time complete power is removed, and the billet is allowed to cool for subsequent removal and use. The vacuum chamber assembly is normally provided with a suitable manipulating means to permit opening of the cover for periodic checking of progress during the solidification period. Total solidification may be noted upon the creation of a "shrink" hole, and/or separation of the recrystallized copper billet from the crucible walls. If for any reason time is considered essential, a water cooling plate may be brought into contact with the crucible to more rapidly cool the solidified billet.

Pressure bursts are produced during heating along with a resulting decrease in the temperature of the copper as a result of the cooling effect generated by the heat of fusion absorbed by the copper on melting. Similarly, during the final cooling there is a period during which the temperature remains relatively constant with decreasing power as the copper releases the heat of fusion upon solidifying. In actual practice, a final five inch diameter and two inch long billet so processed had a grain structure in which approximately one hundred grains in the original billet were reduced to relatively few; i.e., two to six in the resulting recrystallized billet.

The present invention has been found to provide a simple, reliable and practical method of recrystallizing copper in relatively large diameter sizes, with essentially minimal impurities.

BRIEF DESCRIPTION OF THE DRAWINGS

The drawing furnished herewith illustrates a preferred construction of the present invention in which the above advantages and features are clearly disclosed as well as others which will be readily understood from the following description of the illustrated embodiment of the invention.

In the drawings.

DESCRIPTION OF THE ILLUSTRATED EMBODIMENT

Figure 1:
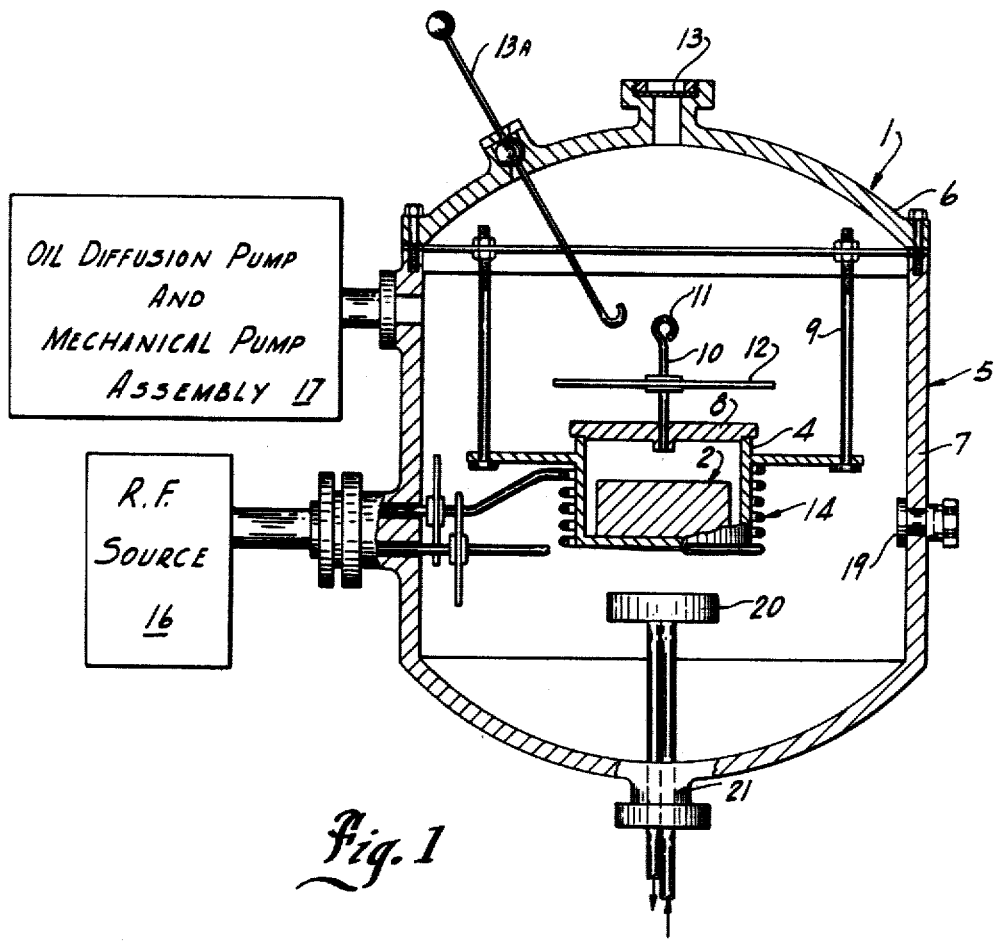
FIG. 1 is a diagrammatic illustration of apparatus for carrying out the copper recrystallization method according to the present invention.

Referring to the drawing and particularly to FIG. 1, a suitable apparatus 1 for use in the recrystallization of a copper billet 2 according to the invention, is illustrated.

As is shown, vacuum melting apparatus 1 includes a cylindrical crucible 4 within which a copper billet or mass 2 is located. Crucible 4 is suspended within a vacuum chamber 5.

Vacuum chamber 5 is illustrated as a conventional cylindrical water cooled chamber comprising a cup-shaped body 7 and a domed cover 5. Cover 6 is releasably joined to the top of body 7 along a vacuum tight joint. The cylindrical crucible 4 is preferably formed of graphite and is slightly larger than the copper billet 2 which is to be melted and recrystallized. The enlarged crucible allows for expansion of the billet. The illustrated crucible 4 is a cup-shaped member having a removable top or cover 8.

Crucible 4, in accordance with usual construction, is suspended in the vacuum chamber 5 by suitable rods 9. A manipulating handle 10 projects upwardly from the cover 8 and terminates in a top hook 11. A shield 12 of molybdenum or the like is secured to the manipulating handle element 10 in spaced overlying relation to cover 8 to prevent copper vapor from obscuring vision through the viewing opening 13 in the top of chamber cover 6.

An induction heating coil 14 is mounted to encircle the lower portion of crucible 4, below supporting rods 9. Coil 14 is connected through a suitable feeder connection to a radio frequency source 16 for energization of the induction coil 14, thereby to heat the crucible and copper billet by electromagnetic induction. The power supply is of a sufficient level to increase the temperature of the copper billet to its melting temperature and above. An oil diffusion and mechanical vacuum pump unit 17 is connected to the upper sidewall of the chamber 5 and is operable to establish the desired vacuum within chamber 5.

Top view port 13 of heat proof glass or the like material is provided in chamber cover 6 to permit viewing into chamber 5, and particularly crucible 4, to enable one to remove crucible cover 8 by manipulation of the element 13A extending into the chamber. A heat proof window 19 may also be provided in the sidewall of chamber 5 to permit use of an optical pyrometer to continuously monitor the temperature of the metal copper billet 2.

In the illustrated embodiment of the recrystallization apparatus, a water cooled plate 20 is located within vacuum chamber 5 and can be adjustably mounted for vertical positioning via a suitable sliding feed unit 21 at the bottom of the vacuum chamber body 7.

Figure 2:
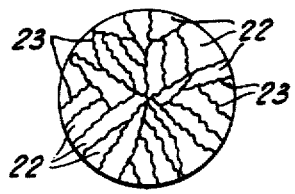
FIG. 2 is a diagrammatic illustration of the surface of a presently available copper billet illustrating a high multiple grain structure.

The present invention is directed to the process of controlled melting and resolidification of a copper billet but more particularly, to the controlled cooling of copper to develop a solid recrystallized body which is essentially single-crystal or grain and of a diameter slightly less than the internal diameter of crucible 4. According to the method of the invention, a copper billet having a multiple crystal structure, such as shown in FIG. 2, is melted and recrystallized with a significant reduction in the grain structure, resulting in an essentially single grain billet of the type illustrated in FIGS. 3 and 4. The copper billet 2 may be any commercially available oxygen-free, high conductivity copper of the type used in the power industry.

The billet 2, prior to assembly within melting crucible 4, is scrubbed and surface cleaned to remove dirt, oil, grease and other impurities, films and the like. In a preferred method of carrying out the invention, the copper billet 2 is cleaned with a wire brush, followed by washing with distilled water and a conventional commercially available soap or household cleanser, such as the widely known Comet or Ajax. The water is removed by rinsing with methyl alcohol and the billet is dried by a warm stream of air to evaporate the alcohol. After mechanical cleaning in this manner, the copper is further chemically cleaned such as by a "bright dip" acid process. A "bright dip" bath which may be formed of 55% phosphoric acid, 25% acetic acid and 20% nitric acid measured by volume may be used. The billet is dipped into the bath until the rate of reaction has decreased significantly. For a five inch copper billet, approximately thirty seconds were found to be sufficient.

The "bright dipped" copper billet is then subjected to two rinse cycles, each of which includes rinsing with distilled water and methyl alcohol, followed by warm air drying to complete the surface cleaning process.

The cleaned copper billet 2 is then placed into the graphite crucible and transferred to the vacuum melting apparatus 1.

In FIG. 2, a typical cross section of an oxygen-free, high conductivity copper bar or billet approximately five inches in diameter and two inches in height is shown. The prior art copper billet 2 of FIG. 2 includes a substantial number of individual copper crystals or grains 22 joined at grain boundaries 23, each of which most likely include impurities, particularly entrapped gases. Refining of the billet in accordance with the present invention generates a billet having generally only a few individual crystals of grains.

Figure 3:
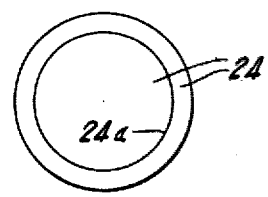
FIG. 3 is a similar view illustrating one surface of a copper billet recrystallized in accordance with the method of the present invention and illustrating a reduced grain structure.
Figure 4:
FIG. 4 is a view of the opposite end of the copper billet of FIG. 3 illustrating a slightly greater grain structure, but significantly less than the prior art billet of FIG. 2.

FIG. 3 illustrates the bottom surface of a billet formed by the method of the present invention. The billet of FIG. 3 includes a single pair of grains 24 with a boundary 24a. FIG. 4 is a view of the top surface of the billet shown in FIG. 3. The top surface has only six grains 25, constituting a significant reduction in the total grain structure and possible impurity entrapping junctions 27, and, in essence, defines an effective single-grain or crystal copper billet which is approximately five inches in diameter. The top surface being exposed, generally would be expected to include more grains than the lower surface which rests on the floor of the crucible. Thus, the bottom and sidewalls of the crucible tend to provide a controlled somewhat slower cooling which as previously noted has been found to be a significant factor in producing minimal grain copper billets.

More specifically, the method according to the present invention is generally characterized by the following steps:

An oxygen-free, high conductivity copper mass or billet 2 in any shape that will fit within graphite crucible 4 with suitable clearance for thermal expansion of the copper mass and the graphite crucible, is first mechanically and then chemically surface cleaned. After cleaning, copper mass 2 is located in crucible 4 within vacuum chamber 5 and after a minimum vacuum is created, crucible 4 and copper mass 2 is slowly heated to outgas the various surrounding parts. Thereafter the temperature is increased to melt the copper mass. The vacuum in chamber 5 is also increased. Generally, the copper mass is melted at a temperature of 1350 degrees centigrade in a vacuum on the order of $3 \times 10^{-6}$ torr. The temperature is then significantly reduced to initiate a natural cooling process and recrystallization of the melted copper mass under pressure. The melted copper mass is cooled initially to create an essentially equilibrium temperature just above the melting temperature of copper after which a slow cooling process is established to produce solidification of the melted copper mass, without agitation or the addition of any external cooling means. After complete solidification the heat is removed and the assembly is allowed to cool without any external cooling assistance. If time is important, additional cooling may be introduced after solidification of the billet in the crucible to permit removal from the vacuum chamber and from the crucible.

It has been found that melting of the copper billet and the controlled solidification without the addition of any gettering material, agitation of the melted copper or the like results in a dramatic recrystallization effect such that a relatively large diameter copper mass has only a few grains present in the solid. This concept of melting at approximately 1350 degrees and at a pressure of approximately $3.0 \times 10^{-6}$ torr, followed by slow controlled natural cooling has been used to produce a minimal grained, cylindrical copper billet five inches in diameter and two inches in thickness or length. A six inch outside diameter graphite crucible having a wall thickness of 5/16 inches has been employed in the method according to the invention. The crucible is located within a one hundred liter vacuum chamber. An inductive heating coil was connected to a 20 kw radio frequency induction generator.

Generally, copper billet 2 is heated for approximately thirty minutes to outgas the crucible and surrounding parts without degradation of the copper billet. Maximum RF power is then applied and maintained for about seventy-five minutes after the initial melting of the copper billet 2. The RF power is then reduced to a level which will establish the melted copper at its equilibrium temperature of approximately 1100 degrees, or slightly above its melting point of 1083 degrees. When an equilibrium temperature has been reached a cooling rate of about 3 to 15 degrees centigrade per hour is created by slowly reducing the RF power supplied to the induction coil. A three degree centigrade per hour reduction in temperature achieves a particularly slow but practical solidification rate.

The actual solidification process can be visually checked periodically by removal of the crucible cover 8 to observe the state of the copper billet within the crucible 4. Complete solidification will be indicated by the observation of a "shrink" hole as well as the separation of the recrystallized copper billet from the crucible wall.

When solidification is complete, the induction coil 14 is deenergized. The total system is then preferably allowed to cool naturally without the addition of any external cooling. If, for any reason time is significant, the cooling can at the final stage be forced by bringing cooling plate 20 into contact with the bottom of the crucible. No significant forced cooling should be used before essentially completely solidifying the melted copper billet. After all parts have been cooled, the system is purged with nitrogen or other suitable gas and the recrystallized copper billet is then easily removed from the crucible.

A typical example of one complete heating and complete recrystallization sequence is as follows:

| Time | R.F. Plate-amps. (power) | Temp. °C. | Chamber Pressure torr |
|---|---|---|---|
| 0 | 3.0 | 1250 | $2.0 \times 10^{-4}$ |
| 30 | 3.5 | 1440 | $8.4 \times 10^{-5}$ |
| 40 | 3.5 | 1440 | $6.3 \times 10^{-5}$ |
| 50 | 3.5 | 1442 | $2.3 \times 10^{-5}$ |
| 55 | 3.5 | 1442 | $4.3 \times 10^{-5}$ |
| 56 | 3.5 | 1358 | $9.0 \times 10^{-5}$ |
| 57 | 3.5 | 1230 | $7.0 \times 10^{-5}$ |
| 58 | 3.5 | 1180 | $7.0 \times 10^{-5}$ |
| 59 | 3.5 | 1250 | $6.2 \times 10^{-5}$ |
| 60 | 3.5 | 1325 | $6.0 \times 10^{-5}$ |
| 62 | 3.5 | 1385 | $4.7 \times 10^{-5}$ |
| 65 | 3.5 | 1390 | $2.8 \times 10^{-5}$ |
| 70 | 3.5 | 1390 | $1.6 \times 10^{-5}$ |
| 130 | 3.5 | 1390 | $5.0 \times 10^{-6}$ |

The heating cycle begins after the RF frequency has created a temperature of approximately 1250° and a relatively low chamber pressure has been established. The recorded temperatures are those of the crucible. The melted copper billet temperature may be expected to be on the order of 10 degrees lower. This provides outgassing of the crucible and associated components without any significant melting of the billet. At the time of thirty minutes, the RF power was increased to 3.5 RF plate-amps and held at that setting for approximately one hundred minutes. During this period, the temperature was increased rapidly to 1440° C. During the same period, the vacuum chamber pressure increased. At approximately time 56 minutes, even though the RF input power remained constant, there was a significant decrease in the temperature and a sudden increase in pressure. This condition existed for a short period, generally through time 60 minutes, after which the temperature again increased and the pressure decreased as shown at time 62 minutes. The temperature decrease was caused by the cooling effect resulting from the absorption by the copper of the heat of fusion. The temperature of the copper melt was then held essentially constant at 1390° C. until time 130 minutes. The RF power was then significantly reduced, preferably rapidly reducing the temperature to that approaching, but slightly above the melting temperature of copper and thereby conditioning the melted copper billet for the cooling state which, in this case, was as follows:

| Time | R.F. Plate-amps. (power) | Temp. °C. | Chamber Pressure torr |
|---|---|---|---|
| 130 | 2.2 | — | — |
| 140 | 2.2 | 1130 | $3.0 \times 10^{-6}$ |
| 150 | 2.2 | 1130 | $3.0 \times 10^{-6}$ |
| 150 | 2.1 | — | — |
| 160 | 2.1 | 1110 | $2.7 \times 10^{-6}$ |
| 170 | 2.1 | 1110 | $2.7 \times 10^{-6}$ |
| 170 | 2.05 | — | — |
| 180 | 2.05 | 1095 | $2.5 \times 10^{-6}$ |
| 190 | 2.05 | 1095 | $2.5 \times 10^{-6}$ |
| 190 | 2.0 | — | — |
| 200 | 2.0 | 1095 | $2.3 \times 10^{-6}$ |
| 210 | 2.0 | 1095 | $2.3 \times 10^{-6}$ |
| 300 | 2.0 | 1085 | $2.0 \times 10^{-6}$ |
| 300 | 0 | — | — |

Reduction of the RF power to 2.2 RF plate-amps resulted in the cooling of the melted copper billet to approximately 1130 degrees after ten minutes. It was held at this temperature by holding the RF power constant for approximately twenty minutes. The RF power was then again reduced lightly to 2.1. RF plate-amps with a resulting drop in the temperature to 1110 degrees. Thus, between time 130 and time 170, the melted copper billet was reduced in temperature by 20° C. Power was then reduced to 2.05 RF plate-amps resulting in a further drop of the temperature to 1095° C. and the chamber pressure to $2.5 \times 10^{-6}$ torr, where the temperature and power level were held for twenty minutes. The power was again decreased to 2.0 RF plate-amps and held thereat for an additional twenty minutes. During this total period, the temperature, however, remained constant at approximately 1095° C. During the process, it was noted that even though the RF power was significantly reduced, there was no decrease in the temperature of the melted copper billet from time 170 to time 210. The constant temperature, with decreasing power, is a result of the release of heat of fusion during the solidification of the copper. Ninety minutes later, with the same RF plate-amps, the unit had cooled to approximately 1085° C. Complete solidification of the melted copper billet had resulted and power was removed.

Cooling is of course controlled by reducing the power and is selected to be as slow as practical. For example, one tenth of a degree per hour would be ideal but the time required for cooling would be excessive for practical purposes. Generally, a range of cooling of three to fifteen degrees per hour appears to be acceptable.

The copper billet formed in accordance with the above described example resulted in one such as illustrated in FIGS. 3 and 4, having top and bottom surfaces like those shown. For purposes of analysis, both surfaces were machined flat, then polished to a mirror finish. A 1600× magnification instrument was employed for visual observation of the mirrored finish. Essentially, no porosity could be seen, and no grain boundaries were observed.

Subsequently, the surfaces were carefully etched for approximately one and one-half to two minutes with a water concentrated ammonium hydroxide mixture of approximately four parts water to one part concentrated ammonium hydroxide by volume (a very small amount of cupric chloride was also added for macroscopic observation).

For microscopic observation, the surfaces were etched with a mixture of two parts water with two parts of concentrated ammonium hydroxide and one part of 3% hydrogen pyroxide. The etching time was approximately five to six seconds. Grain structure resulting from such observation was typically as shown in FIGS. 3 and 4. Thus, in FIG. 3 a single-grain boundary was found, indicating a single pair of grains with a larger outer grain on the order of five inches in diameter. In FIG. 4, a slight additional number of small grains were observed. Any impurities remaining were concentrated at the grain boundaries, but this was minimal.

Figure 5:
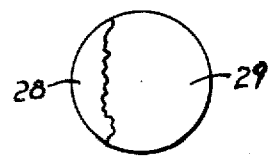
FIG. 5 is a view illustrating the end surface of another embodiment of a recrystallized copper billet formed in accordance with the method according to the invention.

The results of the invention were further confirmed upon a recrystallized billet of the type shown in FIG. 5. An inspection was made using back reflection X-ray photography with molybdenum K alpha radiation, to reveal the crystal orientations relative to the flat polished surfaces. Essentially, only two different crystal orientations 28 and 29 could be found, and the orientations were very similar. The two distinct areas were clearly single crystals since the back reflection X-ray photographs showed identical spots in the areas. It was noted that the crystal orientation, in the copper billet of FIG. 5 was in alignment with the slight linelike craze or defect in the crucible used to recrystallize the copper. This it appears would explain the production of the crystal boundary. Thus, it seems likely that any slight impurity or flaw in the crucible employed in the method according to the invention could produce an area whereat the rate of solidification of the billet may vary, resulting in multiple crystal formation.

Various modes of carrying out the invention are contemplated as being within the scope of the following claims, particularly pointing out and distinctly claiming the subject matter which is regarded as the invention.

I claim:

1. The method of forming a copper billet having a minimal grain structure comprising the steps of; placing a solid mass of generally high purity, oxygen free, high conductivity copper into an enclosed chamber, creating a vacuum in said chamber, increasing the temperature within said chamber to melt said copper mass and for degasification thereof and cooling the melted copper mass in said vacuum nondirectionally at a rate of approximately 3°–15° C. per hour for resolidification and recrystallization thereof into said copper billet.

2. The method of claim 1 including initially washing and chemically cleaning the surface of said copper mass.

3. The method of claim 2 including rinsing said copper mass with distilled water and with methyl alcohol after washing and chemically cleaning, and warm air drying of the mass after each rinsing.

4. The method of claim 1 further including the steps of heating said copper mass to a temperature in excess of 1300° C., reducing the heating to establish an equilbrium temperature on the order of 1100° C., and thereafter cooling said copper mass at the rate of approximately 3° C. per hour.

5. The method of claim 4 further including the step of applying cooling means to said copper mass subsequent to the resolidification and recrystallization thereof.

6. The method of claim 1 further including the step of purging said resulting copper billet with a gaseous medium subsequent to cooling.

7. The method of claim 6 wherein said gaseous medium includes nitrogen.

8. The method of claim 1 including the steps of mechanically washing the exterior surface of said copper mass, rinsing the exterior surface thereof with distilled water and methyl alcohol, drying the exterior surface thereof with warm air, chemically cleaning the exterior surface of said copper mass by dipping in an acid bath, placing the cleaned copper mass in a cup-shaped graphite crucible having a removable cover, placing the crucible in a vacuum chamber and within an R-F induction heating coil, energizing said coil to heat said copper mass to a temperature in excess of 1300° C., reducing the energization of said coil to reduce the heating and establishing an equilibrium temperature on the order of 1100° C., thereafter reducing the energization and heating to cool the copper mass at the rate of approximately 3° to 15° C. per hour, terminating the energization of said coil, maintaining the resulting resolidified and recrystallized copper billet in said vacuum until cooled to a handling temperature and purging the copper billet with a gaseous medium, and removing said recrystallized copper billet.

9. The method of claim 8 wherein said chemically cleaning step includes dipping in a "bright dip" acid bath, of 55% phosphoric acid, 25% acetic acid and 20% nitric acid by volume, and further including the steps of rinsing the exterior surface with distilled water and methyl alcohol and drying the exterior surface with warm air, after said washing and again after said "dipping".

10. The method of forming a copper billet having a minimal grain structure from a generally high purity, oxygen free, high conductivity, multiple grain copper billet, comprising the steps of cleaning the exterior surface of said multiple grain, copper billet, placing the cleaned multiple grain copper billet in a cup-shaped, crucible having a removable cover, placing the crucible in a vacuum chamber, creating a vacuum in said chamber at least on the order of $10^{-6}$ torr, heating said crucible and said multiple grain copper billet to remove free gases therefrom, further heating said multiple grain copper billet to a temperature in excess of 1300° C., reducing the temperature to establish an equilibrium temperature on the order of 1100° C., and then further reducing the heating to permit a cooling and resolidification and recrystallization of said copper billet at the rate of 3° C. to 15° C. per hour.

11. The method of claim 10 including the step of terminating the heating, maintaining said recrystallized copper billet in said vacuum until a cooled to a handling temperature, purging the system with nitrogen and removing said recrystallized copper billet.

12. The method of claim 10, wherein said cleaning includes a first washing of the exterior surface of said multiple grain copper billet with a cleaning liquid, rinsing the exterior surface thereof with distilled water and methyl alcohol, drying the exterior surface thereof with warm air, chemically cleaning the exterior surface thereof by dipping in a "bright dip" acid bath of 55% phosphoric acid, 25% acetic acid and 20% nitric acid by volume, rinsing the exterior surface thereof with distilled water and methyl alcohol and drying the exterior surface thereof with warm air.

13. The method of forming a recrystallized copper billet with minimal grain structure on the order of ten grains or less comprising placing a solid mass of generally high purity, oxygen free, high conductivity copper in a crucible having an inner diameter slightly greater than the diameter of said copper mass, slowly heating the crucible in a vacuum to outgas the crucible and copper mass, increasing the heating rate to melt said copper mass at approximately 1350° C. in a vacuum of approximately $3 \times 10^{-6}$ torr, and slowly cooling said melted copper mass to a recrystallized solid in said vacuum with a non-directional cooling and without agitation of the melted copper mass.

14. The method of claim 13 wherein said cooling is carried out at the rate of approximately 3 to 15 degrees centigrade per hour.

* * * * *